US012563835B2

(12) United States Patent
Tian et al.

(10) Patent No.: US 12,563,835 B2
(45) Date of Patent: Feb. 24, 2026

(54) DRIVE BACKPLANE, METHOD FOR MANUFACTURING SAME, AND DISPLAY PANEL

(71) Applicant: BOE Technology Group Co., Ltd., Beijing (CN)

(72) Inventors: Hongwei Tian, Beijing (CN); Yanan Niu, Beijing (CN); Jing Wang, Beijing (CN); Ran Li, Beijing (CN); Xueyan Tian, Beijing (CN); Zheng Liu, Beijing (CN); Libin Liu, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 430 days.

(21) Appl. No.: 18/020,601

(22) PCT Filed: May 31, 2022

(86) PCT No.: PCT/CN2022/096252
§ 371 (c)(1),
(2) Date: Feb. 9, 2023

(87) PCT Pub. No.: WO2023/230843
PCT Pub. Date: Dec. 7, 2023

(65) Prior Publication Data
US 2024/0304631 A1 Sep. 12, 2024

(51) Int. Cl.
*H01L 27/12* (2006.01)
*G06V 40/13* (2022.01)
(Continued)

(52) U.S. Cl.
CPC ......... *H10D 86/60* (2025.01); *H10D 86/0221* (2025.01); *H10D 86/423* (2025.01);
(Continued)

(58) Field of Classification Search
CPC .. H10D 86/471; H10D 86/60; H10D 86/0221; H10D 86/423; H10D 86/01;
(Continued)

(56) References Cited

U.S. PATENT DOCUMENTS 11,695,016 B2 * 7/2023 Daitoh ................... H10D 86/60
257/59
2009/0230392 A1 9/2009 Takahara
(Continued)

FOREIGN PATENT DOCUMENTS

CN          101794809 A     8/2010
CN          103367455 A     10/2013
(Continued)

*Primary Examiner* — Nikolay K Yushin
(74) *Attorney, Agent, or Firm* — IPro, PLLC

(57) ABSTRACT
Provided is a drive backplane. The drive backplane includes: a base substrate and a circuit structure. The circuit structure includes a plurality of first thin film transistors and a plurality of second thin film transistors; wherein a first active layer of the first thin film transistor includes a first oxide layer and a second oxide layer, wherein the second oxide layer is disposed on a side of the first oxide layer away from the base substrate, a mobility of the second oxide layer is lower than a mobility of the first oxide layer, and a source and a drain of the first thin film transistor are connected to the second oxide layer; and a second active layer of the second thin film transistor includes a third oxide layer, wherein a mobility of the third oxide layer is lower than the mobility of the first oxide layer.

17 Claims, 4 Drawing Sheets

(51) Int. Cl.

| | |
|---|---|
| *G09G 3/3225* | (2016.01) |
| *H10D 86/01* | (2025.01) |
| *H10D 86/40* | (2025.01) |
| *H10D 86/60* | (2025.01) |

(52) U.S. Cl.
CPC ....... *G06V 40/1318* (2022.01); *G09G 3/3225* (2013.01); *G09G 2300/0426* (2013.01); *G09G 2300/0819* (2013.01); *G09G 2300/0852* (2013.01); *G09G 2300/0861* (2013.01); *G09G 2310/08* (2013.01)

(58) Field of Classification Search
CPC .... H10D 86/40; G09G 3/3208; G09G 3/3225; G09G 3/3226; G09G 3/3266; G09G 3/3677; G09G 2300/0819; G09G 2300/0861; G09G 2300/0426; G09G 2300/0852; G09G 2310/08; G09G 2310/0286; G09G 2310/063; G06V 40/1318; G06V 40/13

See application file for complete search history.

(56) References Cited

U.S. PATENT DOCUMENTS

| | | | |
|---|---|---|---|
| 2010/0176383 A1 | 7/2010 | Park et al. | |
| 2013/0256653 A1 | 10/2013 | Ahn et al. | |
| 2017/0309649 A1 | 10/2017 | Hayashi | |
| 2021/0135144 A1 | 5/2021 | Zhang et al. | |
| 2022/0005839 A1* | 1/2022 | Daitoh | H10D 30/6757 |

FOREIGN PATENT DOCUMENTS

| | | |
|---|---|---|
| CN | 110010626 A | 7/2019 |
| CN | 110752219 A | 2/2020 |

* cited by examiner

DRIVE BACKPLANE, METHOD FOR MANUFACTURING SAME, AND DISPLAY PANEL

CROSS-REFERENCE TO RELATED APPLICATIONS

This application is a U.S. national stage of international application No. PCT/CN2022/096252, filed on May 31, 2022, the disclosure of which is incorporated herein by reference in its entirety.

TECHNICAL FIELD

The present disclosure relates to the field of display panels, and in particular, relates to a drive backplane, a method for manufacturing the same, and a display panel.

BACKGROUND OF THE INVENTION

Thin film transistors (TFTs) are widely used in various display panels due to the advantages of small size, low power consumption, low manufacturing cost and the like.

SUMMARY OF THE INVENTION

Embodiments of the present disclosure provide a drive backplane, a method for manufacturing the same, and a display panel. The technical solutions are as follows.

In some embodiments of the present disclosure, a drive backplane is provided. The drive backplane includes a base substrate and a circuit structure disposed on a bearing surface of the base substrate, and the circuit structure includes a plurality of first thin film transistors and a plurality of second thin film transistors: wherein a first active layer of the first thin film transistor includes a first oxide layer and a second oxide layer that are laminated, the second oxide layer is disposed on a side of the first oxide layer away from the base substrate, a mobility of the second oxide layer is lower than a mobility of the first oxide layer, and a source and a drain of the first thin film transistor are connected to the second oxide layer; and a second active layer of the second thin film transistor includes a third oxide layer, wherein a mobility of the third oxide layer is lower than the mobility of the first oxide layer.

In some embodiments, the second oxide layer and the third oxide layer are disposed in a same layer.

In some embodiments, a material of the second oxide layer is the same as a material of the third oxide layer.

In some embodiments, the first active layer further includes at least one fourth oxide layer. The fourth oxide layer is disposed between the first oxide layer and the second oxide layer, and a mobility of the fourth oxide layer is not higher than the mobility of the first oxide layer, and is not lower than the mobility of the second oxide layer.

In some embodiments, the mobility of the first oxide layer ranges from 30 cm$^2$/V·m to 100 cm$^2$/V·m, and the mobility of the second oxide layer ranges from 5 cm$^2$/V·m to 10 cm$^2$/V·m.

In some embodiments, a material of the first oxide layer is one of indium zinc oxide, hydrogen doped indium gallium oxide, indium tin zinc oxide, tin zinc oxide, indium gallium tin zinc oxide and crystallized indium gallium zinc oxide, and the material of the second oxide layer and the material of the third oxide layer are indium gallium zinc oxide.

In some embodiments, the circuit structure further includes a first light-shielding layer and a second light-shielding layer: wherein the first light-shielding layer is disposed on a side of the first active layer close to the base substrate, and an orthographic projection of the first light-shielding layer on the bearing surface of the base substrate at least partially overlaps an orthographic projection of the first active layer on the bearing surface of the base substrate; and the second light-shielding layer is disposed on a side of the second active layer close to the base substrate, and an orthographic projection of the second light-shielding layer on the bearing surface of the base substrate at least partially overlaps an orthographic projection of the second active layer on the bearing surface of the base substrate.

In some embodiments, the base substrate includes a display region and a frame region, wherein the frame region is disposed on at least one side of the display region, and the circuit structure includes a pixel drive circuit, wherein the pixel drive circuit is disposed in the display region, and the pixel drive circuit includes the first thin film transistor and the second thin film transistor.

In some embodiments, the circuit structure further includes a gate driver, wherein the gate driver is disposed in the frame region, and the gate driver includes the first thin film transistor.

In some embodiments, the circuit structure further includes an optical acquisition circuit, wherein the optical acquisition circuit is disposed in the display region, and the optical acquisition circuit includes the first thin film transistor.

In some embodiments of the present disclosure further, a method for manufacturing a drive backplane is provided. The method includes:

providing a base substrate;

forming a first oxide layer on a bearing surface of the base substrate by a patterning process;

forming a second oxide layer and a third oxide layer on the bearing surface of the base substrate by the patterning process to obtain a first active layer and a second active layer, wherein the second oxide layer is disposed on a side of the first oxide layer away from the base substrate, and a mobility of the second oxide layer and a mobility of the third oxide layer are both lower than a mobility of the first oxide layer; and forming a source, a drain and a gate on both the first active layer and the second active layer to obtain a first thin film transistor and a second thin film transistor.

In some embodiments, forming the second oxide layer and the third oxide layer on the bearing surface of the base substrate by the patterning process includes:

forming an oxide material layer on the base substrate; and removing the oxide material layer in a region outside the first oxide layer and outside a region where the second active layer is to be formed on the base substrate, to form the second oxide layer and the third oxide layer.

In some embodiments of the present disclosure, a display panel is further provided. The display panel includes the drive backplane described in above embodiments.

BRIEF DESCRIPTION OF DRAWINGS

For clearer descriptions of the technical solutions in the embodiments of the present disclosure, the following briefly describes the accompanying drawings required for describing the embodiments. The accompanying drawings in the following description show merely some embodiments of the present disclosure, and those of ordinary skill in the art may still derive other drawings from these accompanying drawings without creative effort.

DETAILED DESCRIPTION

In order to make the objectives, technical solutions and advantages of the present disclosure clearer, the embodiments of the present disclosure will be described in detail below with reference to the accompanying drawings.

Unless otherwise defined, the technical terms or scientific terms used herein shall have the general meanings as understood by one of ordinary skill in the art to which this disclosure belongs. The terms "first," "second," "third," and similar terms used in the description and claims of the present disclosure do not denote any order, quantity, or importance, but are merely used to distinguish between different components. Likewise, similar terms "one or a/an" and the like do not limit the quantity, but rather denote the presence of at least one. Similar terms "comprise" or "include" and the like are intended to indicate that the element or article before "comprise" or "include" covers the element or article after "comprise" or "include" and equivalents thereof, without excluding other elements or articles. Similar terms such as "connected to" or "connected with" are not limited to physical or mechanical connections, but may include electrical connections, whether direct or indirect. The terms "upper," "under," "left," "right" and the like are only used to indicate the relative positional relationship, and when the absolute position of a described object changes, the relative positional relationship may also change accordingly.

A pixel drive circuit generally includes a driving TFT (DTFT) and a switching TFT (STFT). The driving TFT is usually a low temperature poly-silicon thin film transistor (LTPS TFT), and the switching TFT is usually a metal oxide thin film transistor (Oxide TFT).

The LTPS TFT has a high mobility, but the leakage current is large, which results in a large power consumption of the display panel under a low-frequency driving.

Figure 1:
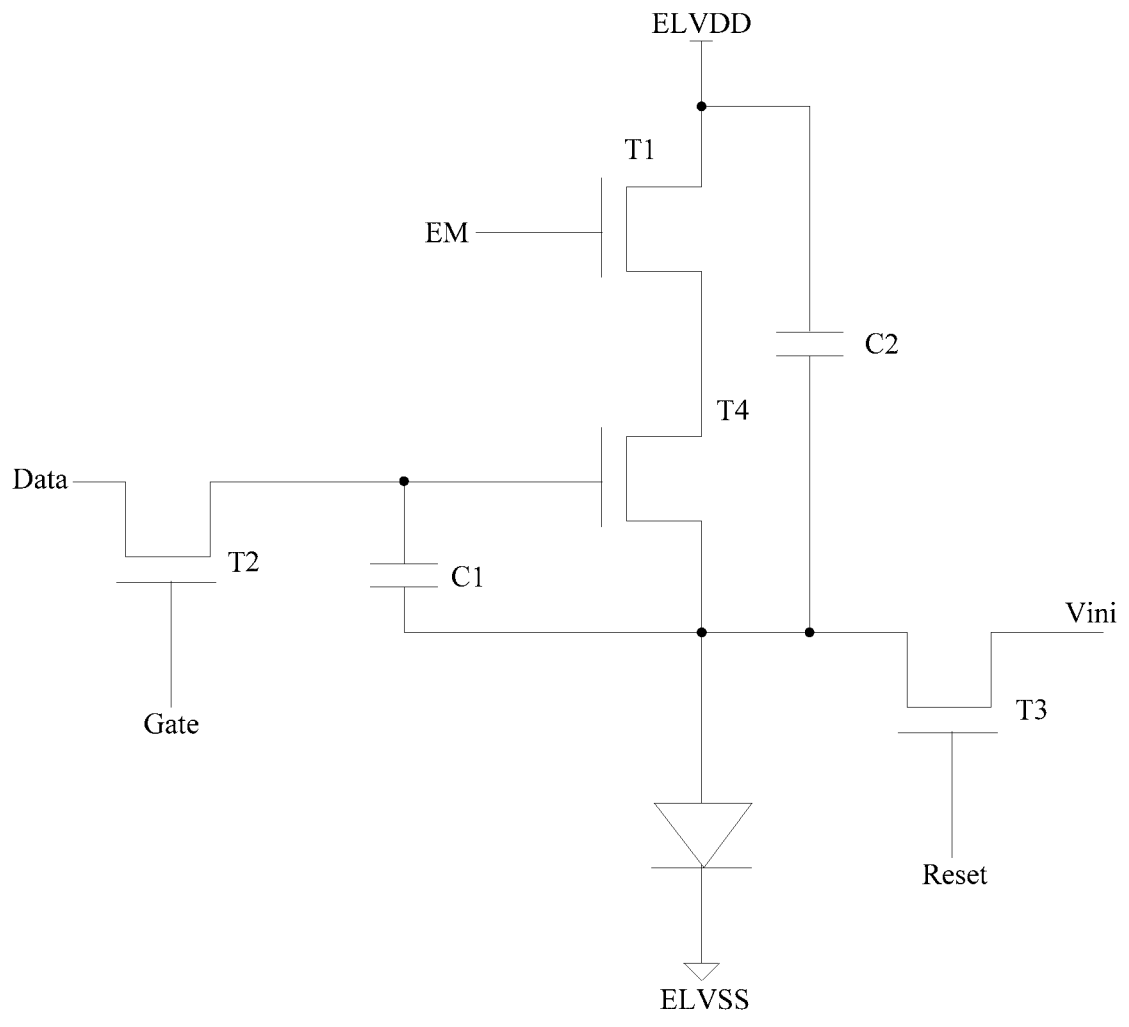
FIG. 1 is a circuit diagram of a pixel drive circuit of a display panel according to some embodiments of the present disclosure.

FIG. 1 is a circuit diagram of a pixel drive circuit of a display panel according to some embodiments of the present disclosure. As shown in FIG. 1, the pixel drive circuit is a 4T2C circuit, that is, the pixel circuit includes four thin film transistors and two capacitors. The thin film transistor T3 is a switching transistor, i.e., STFT; and the thin film transistor T4 is a driving transistor, i.e., DTFT.

One electrode of the thin film transistor T1 is connected to a first voltage ELVDD, and the other electrode of the thin film transistor T1 is connected to the first electrode of the thin film transistor T4. The gate of the thin film transistor T1 is configured to input a light-emitting control signal EM. The second electrode of the thin film transistor T4 is connected to one electrode of a light-emitting unit, and the other electrode of the light-emitting unit is connected to a second voltage ELVSS. One of the first electrode and the second electrode is a source, and the other one of the first electrode and the second electrode is a drain.

One electrode of the thin film transistor T2 is configured to input a data signal Data, and the other electrode of the thin film transistor T2 is connected to the gate of the thin film transistor T4. The gate of the thin film transistor T2 is configured to input a scan signal Gate.

One electrode of the thin film transistor T3 is configured to input a third voltage Vini, and the other electrode of the thin film transistor T3 is connected to the second electrode of the thin film transistor T4. The gate of the thin film transistor T3 is configured to input a reset signal Reset.

Two electrodes of the capacitor C1 are respectively connected to the gate and the second electrode of the thin film transistor T4, and two electrodes of the capacitor C2 are respectively connected to the second electrode of the thin film transistor T4 and the electrode, connected to the first voltage ELVDD, of the thin film transistor T1.

Generally, the driving transistor adopts a low temperature poly-silicon thin film transistor, that is, the active layer is made from a low temperature poly-silicon semiconductor material, such that the driving transistor has a higher mobility, and the time of charging the capacitor is shortened. However, the leakage current of the low temperature poly-silicon thin film transistor is large, and the power consumption of the display panel under the low frequency driving is also high. In order to avoid this problem, the embodiments of the present disclosure provide a drive backplane.

Figure 2:
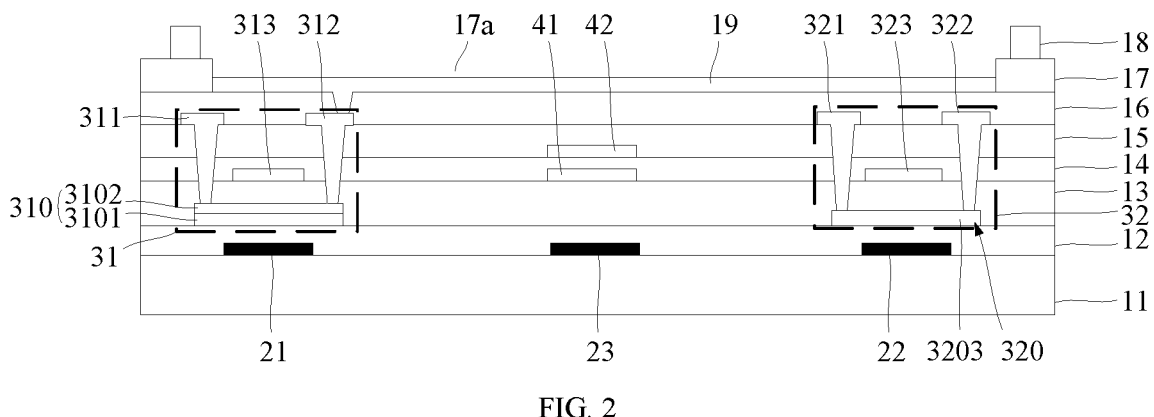
FIG. 2 is a schematic structural diagram of a drive backplane according to some embodiments of the present disclosure.

FIG. 2 is a schematic structural diagram of a drive backplane according to some embodiments of the present disclosure. As shown in FIG. 2, the drive backplane includes a base substrate 11 and a circuit structure disposed on a bearing surface of the base substrate 11. The circuit structure includes a plurality of first thin film transistors 31 and a plurality of second thin film transistors 32.

The first thin film transistor 31 includes a first active layer 310, a first source 311, a first drain 312, and a first gate 313. The first source 311 and the first drain 312 are connected to the first active layer 310. The first gate 313 is disposed above the first active layer 310, and an orthographic projection of the first gate 313 on the bearing surface of the base substrate 11 at least partially overlaps an orthographic projection of the first active layer 310 on the bearing surface of the base substrate 11.

The first active layer 310 of the first thin film transistor 31 includes a first oxide layer 3101 and a second oxide layer 3102 that are laminated, and the second oxide layer 3102 is disposed on the side of the first oxide layer 3101 away from the base substrate 11. The mobility of the second oxide layer 3102 is lower than the mobility of the first oxide layer 3101, and the source and the drain of the first thin film transistor 31 are connected to the second oxide layer 3102.

The second thin film transistor 32 includes a second active layer 320, a second source 321, a second drain 322, and a second gate 323. The second source 321 and the second drain 322 are connected to the second active layer 320. The second gate 323 is disposed above the second active layer 320, and an orthographic projection of the second gate 323 on the bearing surface of the base substrate 11 at least partially overlaps an orthographic projection of the second active layer 320 on the bearing surface of the base substrate 11.

The second active layer 320 of the second thin film transistor 32 includes a third oxide layer 3203, and the mobility of the third oxide layer 3203 is lower than the mobility of the first oxide layer 3101.

The first active layer 310 is provided as a laminated structure formed of the first oxide layer 3101 and the second oxide layer 3102, the first source 311 and the first drain 312 are both connected to the second oxide layer 3102 with a lower mobility, the first oxide layer 3101 enables the first active layer 310 to have a high mobility, and the mobility of the second oxide layer 3102 is low. Therefore, the reliability of the first thin film transistor 31 can be ensured, such that the first thin film transistor 31 can operate stably. The low temperature poly-silicon is replaced with the oxide to form the active layer, which can reduce the leakage current and reduce the power consumption of the display panel under the low-frequency driving.

As shown in FIG. 2, a buffer layer 12 is disposed on the bearing surface of the base substrate 11, and the first active layer 310 and the second active layer 320 are disposed on the buffer layer 12. For example, the material of the buffer layer 12 includes at least one of silicon oxide and silicon nitride. The buffer layer 12 has a thickness of 2000 Å to 5000 Å.

In some embodiments, the second oxide layer 3102 and the third oxide layer 3203 are disposed in the same layer. Here, arrangement in the same layer refers to that the two layers are disposed on the surface of the same structure layer, or formed of the same structure by the same patterning process.

The second oxide layer 3102 and the third oxide layer 3203 are disposed in the same layer, which helps reduce the thickness of the circuit structure, thereby reducing the thickness of the drive backplane, and facilitating the thinning of the display panel.

In the embodiments of the present disclosure, the second oxide layer 3102 and the third oxide layer 3203 are made of the same material. That is, the second oxide layer 3102 and the third oxide layer 3203 are formed of the same structure by the same patterning process, which reduces the number of patterning processes and simplifies the manufacturing process of the drive backplane.

The first oxide layer 3101 and the second oxide layer 3102 are metal oxide layers. The material of the first oxide layer 3101 is one of indium zinc oxide (IZO), hydrogen doped indium gallium oxide (IGO:H), indium tin zinc oxide (ITZO), tin zinc oxide (TZO), indium gallium tin zinc oxide (IGTZO), and crystallized indium gallium zinc oxide (IGZO).

For example, the first oxide layer 3101 is an indium zinc oxide (IZO) layer, the second oxide layer 3102 and the third oxide layer 3203 are indium gallium zinc oxide (IGZO) layers.

That is, the first oxide layer 3101 is made of IZO, and the second oxide layer 3102 and the third oxide layer 3203 are made of IGZO. The IZO material has a high mobility, and is suitable for manufacturing the first oxide layer 3101 with a high mobility. The IGZO material has a lower mobility than the IZO material, and is suitable for manufacturing the second oxide layer 3102 and the third oxide layer 3203 with a low mobility.

For example, the mobility of the first oxide layer 3101 ranges from 30 cm$^2$/V·m to 100 cm$^2$/V·m, and the mobility of the second oxide layer 3102 ranges from 5 cm$^2$/V·m to 10 cm$^2$/V·m.

The mobility of the first oxide layer 3101 and the mobility of the second oxide layer 3102 are set in the above corresponding ranges respectively, such that the first active layer 310 has a high mobility, which can satisfy the use requirements of most display panels, and meanwhile, make the first thin film transistor 31 reliable enough, thereby ensuring the stable operation of the display panel.

Figures 3, 4:
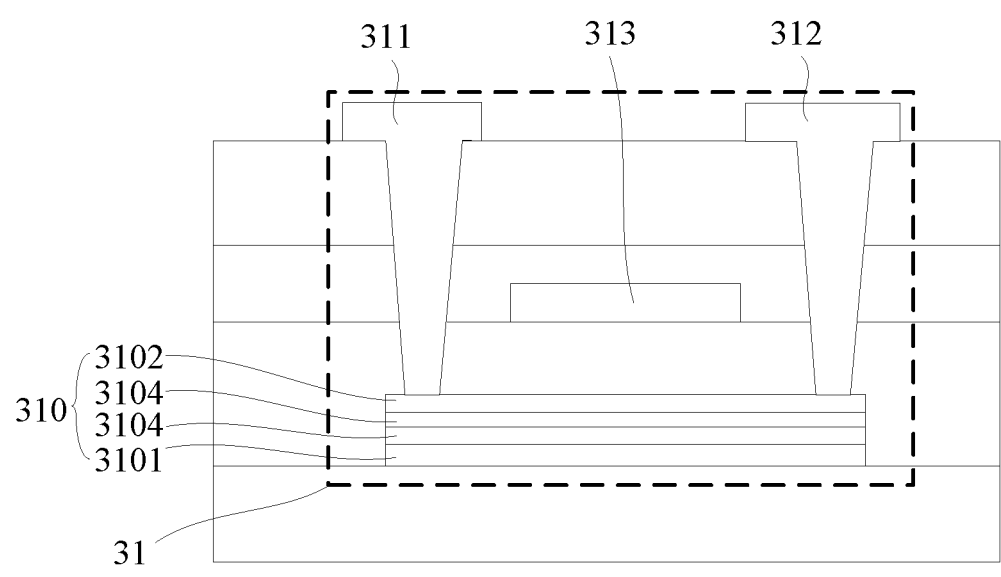
FIG. 3 is a schematic diagram of a partial structure of a drive backplane according to some embodiments of the present disclosure.
FIG. 4 is a schematic diagram of a drive backplane according to some embodiments of the present disclosure.

FIG. 3 is a schematic diagram of a partial structure of a drive backplane according to some embodiments of the present disclosure. As shown in FIG. 3, in the drive backplane, the first active layer 310 further includes at least one fourth oxide layer 3104. The fourth oxide layer 3104 is disposed between the first oxide layer 3101 and the second oxide layer 3102, and the mobility of the fourth oxide layer 3104 is not higher than the mobility of the first oxide layer 3101, and is not lower than the mobility of the second oxide layer 3102.

The fourth oxide layer 3104 with the mobility between the mobility of the first oxide layer 3101 and the mobility of the second oxide layer 3102 can play a buffer function, which can reduce the risk caused by the high mobility of the first oxide layer 3101, improve the reliability of the first thin film transistor 31, and ensure the stable operation of the display panel.

The mobility of the plurality of fourth oxide layers 3104 decreases layer by layer from the first oxide layer 3101 to the second oxide layer 3102.

In order to simplify the manufacturing process, the fourth oxide layer 3104 is made of the same material as the first oxide layer 3101, that is, the fourth oxide layer 3104 is the same as the first oxide layer 3101.

As shown in FIG. 2, the circuit structure further includes a first light-shielding layer 21 and a second light-shielding layer 22.

The first light-shielding layer 21 is disposed on the side of the first active layer 310 close to the base substrate 11, and the orthographic projection of the first light-shielding layer 21 on the bearing surface of the base substrate 11 at least partially overlaps the orthographic projection of the first active layer 310 on the bearing surface of the base substrate 11.

The second light-shielding layer 22 is disposed on the side of the second active layer 320 close to the base substrate 11, and the orthographic projection of the second light-shielding layer 22 on the bearing surface of the base substrate 11 at least partially overlaps the orthographic projection of the second active layer 320 on the bearing surface of the base substrate 11.

The thin film transistor including the active layer made of oxide is easily affected by ambient light irradiation, resulting in change of the characteristics. Therefore, by providing the first light-shielding layer 21 to shield the first active layer 310, the adverse effect of the ambient light on the first thin film transistor 31 is reduced or avoided; and by providing the second light-shielding layer 22 to shield the second active layer 320, the adverse effect of the ambient light on the second thin film transistor 32 is reduced or avoided.

As shown in FIG. 2, the first light-shielding layer 21 and the second light-shielding layer 22 are disposed in the same layer, which facilitates manufacture of the first light-shielding layer 21 and the second light-shielding layer 22 and simplifies the process. The first light-shielding layer 21 and the second light-shielding layer 22 are both disposed on the bearing surface of the base substrate 11, and the buffer layer 12 covers the first light-shielding layer 21, the second light-shielding layer 22, and the bearing surface of the base substrate 11.

The first light-shielding layer 21 and the second light-shielding layer 22 are both non-light-transmitting metal layers. For example, the first light-shielding layer 21 and the second light-shielding layer 22 are both copper layers.

For example, as shown in FIG. 2, the drive backplane includes a base substrate 11, for example, a transparent substrate. The base substrate 11 may be a flexible substrate, such as a polyimide substrate, or may be a rigid substrate, such as a glass substrate.

The first light-shielding layer 21 and the second light-shielding layer 22 are disposed on the bearing surface of the base substrate 11. The buffer layer 12 is disposed on the bearing surface of the base substrate 11, and the buffer layer 12 covers the first light-shielding layer 21, the second light-shielding layer 22, and the bearing surface of the base substrate 11.

The first active layer 310 and the second active layer 320 are disposed on the surface of the buffer layer 12 away from the base substrate 11, and the first active layer 310 and the second active layer 320 correspond to the first light-shielding layer 21 and the second light-shielding layer 22, respectively. The orthographic projections of the first active layer 310 and the first light-shielding layer 21 on the bearing surface of the base substrate 11 at least partially overlap, and the orthographic projections of the second active layer 320 and the second light-shielding layer 22 on the bearing surface of the base substrate 11 at least partially overlap.

The drive backplane further includes a gate insulating layer 13, a first interlayer insulating layer 14, a second interlayer insulating layer 15, a planarization layer 16 and a pixel defining layer 17. The gate insulating layer 13 is disposed on the surfaces, away from the base substrate 11, of the buffer layer 12, the first active layer 310, and the second active layer 320.

The first gate 313 and the second gate 323 are disposed on the surface of the gate insulating layer 13 away from the base substrate 11. The orthographic projection of the first gate 313 on the bearing surface of the base substrate 11 at least partially overlaps the orthographic projection of the first active layer 310 on the bearing surface of the base substrate 11, and the orthographic projection of the second gate 323 on the bearing surface of the base substrate 11 at least partially overlaps the orthographic projection of the second active layer 320 on the bearing surface of the base substrate 11. The first gate 313 and the second gate 323 are disposed in the same layer. The first gate 313 and the second gate 323 are both made of a non-light-transmitting material, such that the side of the first active layer 310 away from the base substrate 11 is shielded by the first gate 313, and the side of the second active layer 320 away from the base substrate 11 is shielded by the second gate 323, thereby preventing the ambient light from affecting the first active layer 310 and the second active layer 320.

A first capacitor electrode 41 is further formed on the surface of the gate insulating layer 13 away from the base substrate 11. A third light-shielding layer 23 is further disposed on the bearing surface of the base substrate 11, and the third light-shielding layer 23 is disposed between the first light-shielding layer 21 and the second light-shielding layer 22. The orthographic projection of the first capacitor electrode 41 on the bearing surface of the base substrate 11 at least partially overlaps the orthographic projection of the third light-shielding layer 23 on the bearing surface of the base substrate 11. The first capacitor electrode 41 and the third light-shielding layer 23 form a capacitor C1, that is, a storage capacitor. The first capacitor electrode 41 is disposed in the same layer as the first gate 313 and the second gate 323, thereby simplifying the manufacturing process.

The first interlayer insulating layer 14 is disposed on the surface of the gate insulating layer 13 away from the base substrate 11, and covers the first gate 313, the second gate 323 and the first capacitor electrode 41.

A second capacitor electrode 42 is further formed on the surface of the first interlayer insulating layer 14 away from the base substrate 11, and the orthographic projection of the second capacitor electrode 42 on the bearing surface of the base substrate 11 at least partially overlaps the orthographic projection of the first capacitor electrode 41 on the bearing surface of the base substrate 11. The third light-shielding layer 23, the first capacitor electrode 41 and the second capacitor electrode 42 collectively form the capacitor C1.

The second interlayer insulating layer 15 is disposed on the surface of the first interlayer insulating layer 14 away from the base substrate 11, and covers the second capacitor electrode 42.

The first source 311, the first drain 312, the second source 321, and the second drain 322 are disposed in the same layer, and are all disposed on the surface of the second interlayer insulating layer 15 away from the base substrate 11. The first source 311 and the first drain 312 are respectively connected to the second oxide layer 3102 of the first active layer 310 through via holes, and the second source 321 and the second drain 322 are respectively connected to the second active layer 320 through via holes.

The planarization layer 16 is disposed on the surface of the second interlayer insulating layer 15 away from the base substrate 11, and covers the first source 311, the first drain 312, the second source 321, and the second drain 322.

The pixel defining layer 17 is disposed on the surface of the planarization layer 16 away from the base substrate 11. The pixel defining layer 17 has a pixel opening 17a. An anode 19 is further disposed in the pixel opening 17a, and the anode 19 is connected to one of the first source 311 and the first drain 312 through a via hole. The anode 19 is an anode of a light-emitting unit, for example, an anode of an organic light-emitting diode. The anode 19 is formed on the surface of the planarization layer 16 away from the base substrate 11 prior to the pixel defining layer 17. When the pixel defining layer 17 is formed, the pixel opening 17a is formed to expose the anode 19.

As shown in FIG. 2, a plurality of spacers 18 are further disposed on the surface of the pixel defining layer 17 away from the base substrate 11. The spacers 18 are outside the pixel opening 17a, and the spacers 18 play a support function in the display panel.

FIG. 4 is a schematic diagram of a drive backplane according to some embodiments of the present disclosure. As shown in FIG. 4, in the drive backplane, the base substrate 11 includes a display region 11a and a frame region 11b. The frame region 11b is disposed on at least one side of the display region 11a. For example, the frame region 11b surrounds the display region 11a.

The circuit structure includes a pixel drive circuit 51. FIG. 4 is illustrated by taking the pixel circuit shown in FIG. 1 as an example. As shown in FIG. 4, the pixel drive circuit 51 is disposed in the display region 11a, and the pixel drive circuit 51 includes a first thin film transistor 31 and a second thin film transistor 32. The first thin film transistor 31 is the first thin film transistor 31 shown in FIG. 2 or FIG. 3, and the second thin film transistor 32 is the second thin film transistor 32 shown in FIG. 2.

By taking the pixel circuit shown in FIG. 4 being the pixel drive circuit 51 as an example, except that the thin film transistor T4. i.e., the DTFT, is provided as the first thin film transistor 31, and the thin film transistor T3, i.e., the STFT, is provided as the second thin film transistor 32, the thin film transistor T1 and the thin film transistor T2 are low temperature poly-silicon thin film transistors or oxide transistors. For example, at least one of the thin film transistor T1 and the thin film transistor T2 has an active layer same as the aforementioned first active layer, to simplify the manufacturing process and improve the display effect of the display panel. For another example, at least one of the thin film transistor T1 and the thin film transistor T2 has an active layer same as the aforementioned second active layer. The above drive circuit is only an example, and for a pixel drive circuit having more thin film transistors, some or all of the other thin film transistors except the DTFT and the STFT are provided as low temperature poly-silicon thin film transistors or oxide transistors. When the thin film transistor is provided as an oxide transistor, the active layer of the oxide transistor is the same as the aforementioned first active layer or second active layer.

The first thin film transistor 31 and the second thin film transistor 32 are disposed in the pixel drive circuit 51, the first thin film transistor 31 is a driving transistor, the second thin film transistor 32 is a switching transistor, and the first active layer 310 of the first thin film transistor 31 is an oxide layer. In this way, the leakage current can be reduced, and the power consumption of the display panel under the low-frequency driving can be reduced. The first oxide layer 3101 in the first active layer 310 has a high mobility, such that the light-emitting unit has a faster response speed, thereby ensuring that the display panel has a better display effect. In addition, the second oxide layer 3102 in the first active layer 310 further ensures the reliability of the first thin film transistor 31, such that the first thin film transistor 31 can stably operate.

In addition, the first active layer 310 of the first thin film transistor 31 is an oxide layer, that is, the first thin film transistor 31 is an oxide thin film transistor. The size of the oxide thin film transistor is smaller than the size of the low temperature poly-silicon thin film transistor. Therefore, the size of the pixel drive circuit 51 can be reduced, which helps increase the aperture ratio of pixels.

As shown in FIG. 4, the circuit structure further includes an optical acquisition circuit 52, and the optical acquisition circuit 52 is disposed in the display region 11*a*. The optical acquisition circuit 52 shown in FIG. 4 is only for illustration, and the specific circuit structure of the optical acquisition circuit 52 is designed based on specific needs. The optical acquisition circuit 52 includes a first thin film transistor 31, and the first thin film transistor 31 is the first thin film transistor 31 shown in FIG. 2 or FIG. 3. For example, the optical acquisition circuit 52 is an optical acquisition circuit for fingerprint identification. The display region 11*a* includes an acquisition region 11*c* that identifies fingerprints. The optical acquisition circuit 52 is disposed in the acquisition region 11*c* to achieve the under-screen fingerprint identification function.

The aforementioned first thin film transistor 31 is provided in the optical acquisition circuit 52, which can not only reduce the power consumption, but also improve the accuracy of fingerprint identification because of the small leakage current.

In other examples, the optical acquisition circuit 52 is an optical acquisition circuit for collecting ambient light intensity.

For other thin film transistors in the optical acquisition circuit 52, some or all of the thin film transistors are provided as low temperature poly-silicon thin film transistors or oxide transistors. When the thin film transistor is an oxide transistor, the active layer of the oxide transistor is the same as the aforementioned first active layer or second active layer.

As shown in FIG. 4, the circuit structure further includes a gate driver 60. The gate driver 60 is disposed in the frame region 11*b*. The gate driver 60 is connected to the plurality of pixel drive circuits 51 and the optical acquisition circuit 52 in the display region 11*a* through a plurality of scanning lines, and the gate driver 60 is configured to output a pulse signal to control the corresponding thin film transistor to be turned on or turned off. The gate driver 60 includes a first thin film transistor 31, which is the first thin film transistor shown in FIG. 2 or FIG. 3.

In the related art, the thin film transistor in the gate driver 60 is a low temperature poly-silicon thin film transistor. In this example, the thin film transistor in the gate driver 60 is provided as the aforementioned first thin film transistor 31. In the first thin film transistor 31, the first oxide layer 3101 enables the first thin film transistor 31 to have a high mobility, which ensures that the gate driver 60 operates normally. The second oxide layer 3102 further ensures the reliability of the first thin film transistor 31, such that the first thin film transistor 31 can stably operate. The low temperature poly-silicon is replaced with the oxide to form the active layer, which can reduce the leakage current and reduce the power consumption of the display panel under the low-frequency driving.

Compared with the low temperature poly-silicon thin film transistor, the oxide thin film transistor is smaller in size, and thus the size of the gate driver 60 can be reduced. Therefore, the frame region 11*b* is smaller, which facilitates the arrangement of the narrow frame, and further improves the screen-to-body ratio of the display panel. The low temperature poly-silicon thin film transistor is usually a PMOS transistor, the oxide thin film transistor is an NMOS transistor, and the PMOS transistor and the NMOS transistor are respectively provided with a gate driver 60. In the embodiments of the present disclosure, in the display region 11*a*, the driving transistor and the switching transistor in the pixel drive circuit 51 are oxide thin film transistors, which are all NMOS transistors, which can reduce the number of the gate drivers 60 to be arranged, and further reduce the size of the frame region 11*b*.

The gate driver 60 generally includes a plurality of thin film transistors, and some or all of the thin film transistors are provided as the first thin film transistors 31. When some of the thin film transistors are provided as the first thin film transistors 31, the other thin film transistors are provided as low temperature poly-silicon thin film transistors or oxide transistors. When the thin film transistor is provided as an oxide transistor, the active layer of the oxide transistor is the same as the aforementioned second active layer.

Figure 5:
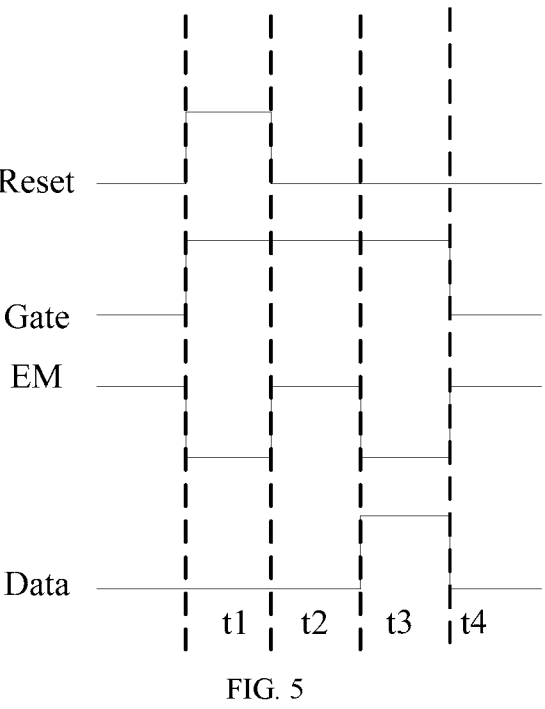
FIG. 5 is a driving timing diagram of the pixel drive circuit shown in FIG. 1 according to some embodiments of the present disclosure.

FIG. 5 is a driving timing diagram of the pixel drive circuit shown in FIG. 1 according to some embodiments of the present disclosure. As shown in FIG. 5, the operation of the pixel drive circuit includes 4 phases, i.e., a t1 phase, a t2 phase, a t3 phase, and a t4 phase. The gate of the thin film transistor T1 inputs a low level signal in the t1 phase and t3 phase and is in the off state, and inputs a high level signal in the t2 phase and t4 phase and is in the on state. The gate of the thin film transistor T2 inputs a high level signal in the t1 phase, t2 phase and t3 phase and is in the on state, and inputs a low level signal in the t4 phase and is in the off state. The gate of the thin film transistor T3 inputs a high level signal in the t1 phase and is in the on state, and inputs a low level signal in the t2 phase, t3 phase and t4 phase and is in the off state. In the t4 phase, the light-emitting unit connected to the thin film transistor T3 emits light.

Figure 6:
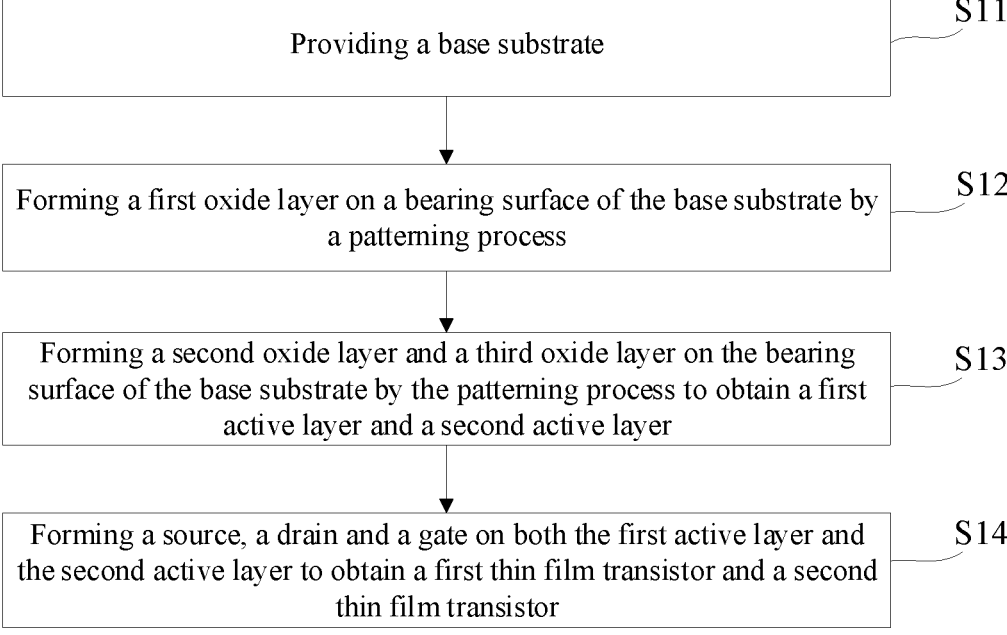
FIG. 6 is a flowchart of a method for manufacturing a drive backplane according to some embodiments of the present disclosure.
Figure 7:
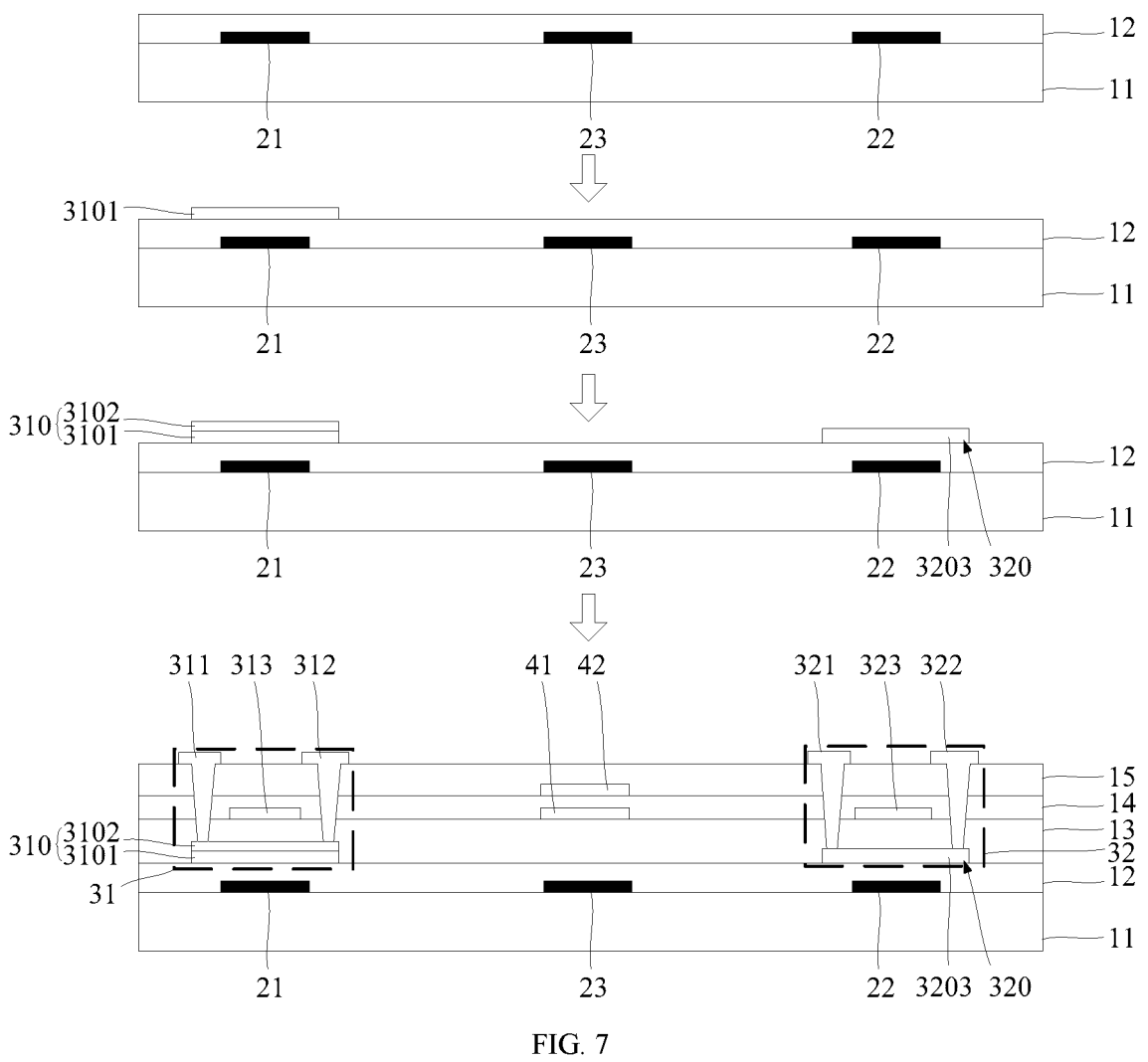
FIG. 7 is a schematic diagram of a manufacturing process of a drive backplane according to some embodiments of the present disclosure.

FIG. 6 is a flowchart of a method for manufacturing a drive backplane according to some embodiments of the present disclosure. The method is applicable to manufacturing the drive backplane shown in FIG. 1. FIG. 7 is a schematic diagram of a manufacturing process of a drive backplane according to some embodiments of the present disclosure. As shown in FIG. 6 and FIG. 7, the manufacturing method includes the following steps.

In step S11, a base substrate is provided.

For example, the base substrate is a transparent substrate. The base substrate 11 may be a flexible substrate, such as a polyimide substrate, or may be a rigid substrate, such as a glass substrate.

A first light-shielding layer 21, a second light-shielding layer 22, a third light-shielding layer 23 and a buffer layer 12 are disposed on the bearing surface of the base substrate 11. The buffer layer 12 covers the first light-shielding layer 21, the second light-shielding layer 22, and the third light-shielding layer 23, and covers the bearing surface of the base substrate 11.

The first light-shielding layer 21, the second light-shielding layer 22 and the third light-shielding layer 23 are formed by a patterning process.

In step S12, a first oxide layer 3101 is formed on the bearing surface of the base substrate 11 by a patterning process.

For example, the first oxide layer 3101 is formed on the surface of the buffer layer 12 away from the base substrate 11 by an atomic layer deposition (ALD) process. The orthographic projection of the first oxide layer 3101 on the bearing surface of the base substrate 11 at least partially overlaps the orthographic projection of the first light-shielding layer 21 on the bearing surface of the base substrate 11.

The first oxide layer 3101 has a high mobility. For example, the first oxide layer 3101 is made of an IZO material.

When the drive backplane shown in FIG. 3 is manufactured, prior to step S13, a plurality of fourth oxide layers 3104 are formed on the first oxide layer 3201. The method for manufacturing the fourth oxide layer 3104 is the same as the method for manufacturing the first oxide layer 3201.

In step S13, a second oxide layer 3102 and a third oxide layer 3203 are formed on the bearing surface of the base substrate 11 by the patterning process to obtain the first active layer 310 and the second active layer 320.

In some embodiments, an oxide material layer is formed on the base substrate 11. Then, the oxide material layer in the region outside the first oxide layer 3101 and outside the region where the second active layer 320 is to be formed on the base substrate 11 is removed, to form the second oxide layer 3102 and the third oxide layer 3203. In this way, the second oxide layer 3102 and the third oxide layer 3203 disposed in the same layer are obtained.

For example, an oxide material layer is formed on the surface of the buffer layer 12 away from the base substrate 11 and the surface of the first oxide layer 3101. Then, a second oxide layer 3102 is formed on the surface of the first oxide layer 3101 away from the base substrate 11 by a patterning process to obtain the first active layer 310, and a third oxide layer 3203 is formed on the surface of the buffer layer 12 away from the base substrate 11 to obtain the second active layer 320. The orthographic projection of the third oxide layer 3203 on the bearing surface of the base substrate 11 at least partially overlaps the orthographic projection of the second light-shielding layer 22 on the bearing surface of the base substrate 11.

The second oxide layer 3102 and the third oxide layer 3203 are formed of the same oxide material layer by the same patterning process, which not only helps reduce the thickness of the drive backplane, but also saves the process.

The mobility of the second oxide layer 3102 and the mobility of the third oxide layer 3203 are lower than the mobility of the first oxide layer 3101. In the embodiments of the present disclosure, the second oxide layer 3102 and the third oxide layer 3203 are disposed in the same layer, and are formed of the same oxide material layer by the same patterning process. For example, the oxide material is IGZO.

In step S14, a source, a drain and a gate are formed on both the first active layer 310 and the second active layer 320 to obtain the first thin film transistor 31 and the second thin film transistor 32.

For example, a gate insulating layer 13, a first interlayer insulating layer 14, and a second interlayer insulating layer 15 are formed on the buffer layer 12. The first gate 313 of the first thin film transistor 31 and the second gate 323 of the second thin film transistor 32 are formed on the buffer layer 12 before the first interlayer insulating layer 14 is formed. The first source 311 and the first drain 312 of the first thin film transistor 31, and the second source 321 and the second drain 322 of the second thin film transistor 32 are formed on the surface of the second interlayer insulating layer 15 away from the base substrate 11. The first source 311 and the first drain 312 of the first thin film transistor 31 are respectively connected to the first active layer 310 through via holes, and the second source 321 and the second drain 322 of the second thin film transistor 32 are respectively connected to the second active layer 320 through via holes.

After the first thin film transistor 31 and the second thin film transistor 32 are formed, other structures are formed according to the specific circuit structures. For example, a planarization layer 16 is formed on the second interlayer insulating layer 15: a pixel defining layer 17 and an anode 19 are formed on the planarization layer 16, the anode 19 is disposed in a pixel opening 17a of the pixel defining layer 17, and the anode 19 is connected to the first source 311 or first drain 312 of the first thin film transistor 31 through a via hole; and a spacer 18 is formed on the pixel defining layer 17, and the spacer 18 is disposed outside the pixel opening 17a of the pixel defining layer 17.

The first active layer 310 is provided as a laminated structure formed of the first oxide layer 3101 and the second oxide layer 3102, the first source 311 and the first drain 312 are both connected to the second oxide layer 3102 with a lower mobility, the first oxide layer 3101 enables the first active layer 310 to have a high mobility, and the mobility of the second oxide layer 3102 is low. Therefore, the reliability of the first thin film transistor 31 can be ensured, such that the first thin film transistor 31 can operate stably. The low temperature poly-silicon is replaced with the oxide to form the active layer, which can reduce the leakage current and reduce the power consumption of the display panel under the low-frequency driving.

The embodiments of the present disclosure further provide a display panel including the drive backplane as shown in FIG. 2 or FIG. 3.

The embodiments of the present disclosure further provide a display device including the aforementioned display panel. The display device is, but not limited to, a mobile phone, a notebook computer, a tablet computer, a display, a navigator, and a digital camera.

The above descriptions are merely optional embodiments of the present disclosure, and are not intended to limit the present disclosure. Any modifications, equivalent substitutions, improvements, and the like made within the spirit and principles of the present disclosure should be included within the protection scope of the present disclosure.

What is claimed is:

1. A drive backplane, comprising a base substrate and a circuit structure disposed on a bearing surface of the base substrate, the circuit structure comprising a plurality of first thin film transistors and a plurality of second thin film transistors; wherein a first active layer of the first thin film transistor comprises a first oxide layer and a second oxide layer which are laminated, wherein the second oxide layer is disposed on a side of the first oxide layer away from the base substrate, a mobility of the second oxide layer is lower than a mobility of the first oxide layer, and a source and a drain of the first thin film transistor are connected to the second oxide layer; and a second active layer of the second thin film transistor comprises a third oxide layer, wherein a mobility of the third oxide layer is lower than the mobility of the first oxide layer;

wherein the base substrate comprises a display region and a frame region, wherein the frame region is disposed on at least one side of the display region; and the circuit structure comprises a pixel drive circuit and an optical acquisition circuit, wherein the pixel drive circuit is disposed in the display region, the pixel drive circuit comprises the first thin film transistor and the second thin film transistor, the optical acquisition circuit is disposed in the display region, and the optical acquisition circuit comprises the first thin film transistor.

2. The drive backplane according to claim 1, wherein the first active layer further comprises at least one fourth oxide layer, wherein the fourth oxide layer is disposed between the first oxide layer and the second oxide layer, and a mobility of the fourth oxide layer is not higher than the mobility of the first oxide layer and is not lower than the mobility of the second oxide layer.

3. The drive backplane according to claim 1, wherein the mobility of the first oxide layer ranges from 30 cm2/V·m to 100 cm2/V·m, and the mobility of the second oxide layer ranges from 5 cm2/V·m to 10 cm2/V·m.

4. The drive backplane according to claim 1, wherein a material of the first oxide layer is one of indium zinc oxide, hydrogen doped indium gallium oxide, indium tin zinc oxide, tin zinc oxide, indium gallium tin zinc oxide and crystallized indium gallium zinc oxide, and a material of the second oxide layer and a material of the third oxide layer are indium gallium zinc oxide.

5. The drive backplane according to claim 1, wherein the circuit structure further comprises a first light-shielding layer and a second light-shielding layer; wherein the first light-shielding layer is disposed on a side of the first active layer close to the base substrate, and an orthographic projection of the first light-shielding layer on the bearing surface of the base substrate at least partially overlaps an orthographic projection of the first active layer on the bearing surface of the base substrate; and the second light-shielding layer is disposed on a side of the second active layer close to the base substrate, and an orthographic projection of the second light-shielding layer on the bearing surface of the base substrate at least partially overlaps with an orthographic projection of the second active layer on the bearing surface of the base substrate.

6. The drive backplane according to claim 1, wherein the circuit structure further comprises a gate driver, wherein the gate driver is disposed in the frame region, and the gate driver comprises the first thin film transistor.

7. The drive backplane according to claim 1, wherein the second oxide layer and the third oxide layer are disposed in a same layer.

8. The drive backplane according to claim 7, wherein a material of the second oxide layer is the same as a material of the third oxide layer.

9. A method for manufacturing a drive backplane, comprising:

providing a base substrate;

forming a first oxide layer on a bearing surface of the base substrate by a patterning process;

forming a second oxide layer and a third oxide layer on the bearing surface of the base substrate by the patterning process to obtain a first active layer and a second active layer, wherein the second oxide layer is disposed on a side of the first oxide layer away from the base substrate, and a mobility of the second oxide layer and a mobility of the third oxide layer are both lower than a mobility of the first oxide layer; and forming a source, a drain and a gate on both the first active layer and the second active layer to obtain a first thin film transistor and a second thin film transistor;

wherein the base substrate comprises a display region and a frame region, wherein the frame region is disposed on at least one side of the display region; and the circuit structure comprises a pixel drive circuit and an optical acquisition circuit, wherein the pixel drive circuit is disposed in the display region, the pixel drive circuit comprises the first thin film transistor and the second thin film transistor, the optical acquisition circuit is disposed in the display region, and the optical acquisition circuit comprises the first thin film transistor.

10. The method according to claim 9, wherein forming the second oxide layer and the third oxide layer on the bearing surface of the base substrate by the patterning process comprises:

forming an oxide material layer on the base substrate; and removing the oxide material layer in a region outside the first oxide layer and outside a region where the second active layer is to be formed on the base substrate, to form the second oxide layer and the third oxide layer.

11. A display panel, comprising a drive backplane, wherein the drive backplane comprises:

a base substrate and a circuit structure disposed on a bearing surface of the base substrate, the circuit structure comprising a plurality of first thin film transistors and a plurality of second thin film transistors; wherein a first active layer of the first thin film transistor comprises a first oxide layer and a second oxide layer which are laminated, wherein the second oxide layer is disposed on a side of the first oxide layer away from the base substrate, a mobility of the second oxide layer is lower than a mobility of the first oxide layer, and a source and a drain of the first thin film transistor are connected to the second oxide layer; and a second active layer of the second thin film transistor comprises a third oxide layer, wherein a mobility of the third oxide layer is lower than the mobility of the first oxide layer;

wherein the base substrate comprises a display region and a frame region, wherein the frame region is disposed on at least one side of the display region; and the circuit structure comprises a pixel drive circuit and an optical acquisition circuit, wherein the pixel drive circuit is disposed in the display region, the pixel drive circuit comprises the first thin film transistor and the second thin film transistor, the optical acquisition circuit is disposed in the display region, and the optical acquisition circuit comprises the first thin film transistor.

12. The display panel according to claim 11, wherein a material of the first oxide layer is one of indium zinc oxide, hydrogen doped indium gallium oxide, indium tin zinc oxide, tin zinc oxide, indium gallium tin zinc oxide and crystallized indium gallium zinc oxide, and a material of the second oxide layer and a material of the third oxide layer are indium gallium zinc oxide.

13. The display panel according to claim 11, wherein the circuit structure further comprises a first light-shielding layer and a second light-shielding layer; wherein the first light-shielding layer is disposed on a side of the first active layer close to the base substrate, and an orthographic projection of the first light-shielding layer on the bearing surface of the base substrate at least partially overlaps an orthographic projection of the first active layer on the bearing surface of the base substrate at least partially overlaps an orthographic projection of the first active layer on the bearing surface of the base substrate; and the second light-shielding layer is disposed on a side of the second active layer close to the base substrate, and an orthographic projection of the second light-shielding layer on the bearing surface of the base substrate at least partially overlaps with an orthographic projection of the second active layer on the bearing surface of the base substrate.

14. The display panel according to claim 11, wherein the second oxide layer and the third oxide layer are disposed in a same layer.

15. The display panel according to claim 14, wherein a material of the second oxide layer is the same as a material of the third oxide layer.

16. The display panel according to claim 11, wherein the first active layer further comprises at least one fourth oxide layer, wherein the fourth oxide layer is disposed between the first oxide layer and the second oxide layer, and a mobility of the fourth oxide layer is not higher than the mobility of the first oxide layer and is not lower than the mobility of the second oxide layer.

17. The display panel according to claim 11, wherein the mobility of the first oxide layer ranges from 30 cm2/V·m to 100 cm2/V·m, and the mobility of the second oxide layer ranges from 5 cm2/V·m to 10 cm2/V·m.

\* \* \* \* \*